(12) United States Patent
Chu et al.

(10) Patent No.: US 7,696,806 B2
(45) Date of Patent: Apr. 13, 2010

(54) LEVEL SHIFT CIRCUIT AND METHOD FOR THE SAME

(75) Inventors: Kwan-Jen Chu, HsinChu (TW); Chien-Ping Lu, Tainan (TW)

(73) Assignee: Richtek Technology Corporation, HsinChu (TW)

( * ) Notice: Subject to any disclaimer, the term of this patent is extended or adjusted under 35 U.S.C. 154(b) by 0 days.

(21) Appl. No.: 12/034,847

(22) Filed: Feb. 21, 2008

(65) Prior Publication Data

US 2009/0212841 A1    Aug. 27, 2009

(51) Int. Cl.
*H03L 5/00* (2006.01)

(52) U.S. Cl. .......................... 327/333; 326/63; 326/81

(58) Field of Classification Search ................ 327/306, 327/333; 326/62–63, 80–81
See application file for complete search history.

(56) References Cited

U.S. PATENT DOCUMENTS

| | | | |
|---|---|---|---|
| 6,522,323 B1 * | 2/2003 | Sasaki et al. | 345/204 |
| 6,987,412 B2 * | 1/2006 | Sutherland et al. | 327/333 |
| 7,176,720 B1 * | 2/2007 | Prather et al. | 326/80 |

* cited by examiner

*Primary Examiner*—Dinh T. Le
(74) *Attorney, Agent, or Firm*—Tung & Associates

(57) ABSTRACT

The present invention discloses a level shift circuit which comprises: an input driver circuit; a capacitor having a first end electrically connected with the output of the input driver circuit; an output driver circuit electrically connected with a second end of the capacitor; and a feedback latch circuit electrically connected between the output of the output driver circuit and the second end of the capacitor, for maintaining the voltage level at the second end of the capacitor.

10 Claims, 5 Drawing Sheets

LEVEL SHIFT CIRCUIT AND METHOD FOR THE SAME

FIELD OF INVENTION

The present invention relates to a level shift circuit, in particular to a level shift circuit achieving level shift from positive supply voltage (VDD) to negative supply voltage (−VDD) with fewer devices, and a corresponding method.

DESCRIPTION OF RELATED ART

A level shift circuit is often used in an electronic circuit for shifting levels of an electronic signal. When it is required to shift the high and low signal operational levels from VDD/0V to 0V/−VDD, conventional circuits require considerably large number of devices. FIG. 1 shows a conventional circuit which needs to shift the high/low levels from VDD/0V to 1/2 VDD/0V, to 1/2 VDD/−1/2 VDD to 0V/−1/2 VDD and lastly to 0V/−VDD. This is obviously not a good solution in the aspects of power conversion efficiency, speed, and the number of devices required. In some conventional circuits the five-stage level shift structure is modified to three-stage level shift structure, removing the stages of 1/2 VDD/0V and 0V/−1/2 VDD; however, this is still not a satisfactory solution.

FIG. 2 shows another conventional circuit which is better than the conventional circuit of FIG. 1 with respect to the speed, but it still requires a relatively large number of devices, and thus, not a satisfactory solution.

In view of the foregoing, it is desired to provide a level shift circuit and a level shift method with fewer devices and higher level shift speed.

SUMMARY

A first objective of the present invention is to provide a level shift circuit achieving level shift from positive supply voltage to negative supply voltage with fewer devices.

A second objective of the present invention is to provide a level shift method.

In accordance with the foregoing and other objectives of the present invention, and from one aspect of the present invention, a level shift circuit comprises: an input driver circuit; a capacitor having a first end electrically connected with the output of the input driver circuit; an output driver circuit electrically connected with a second end of the capacitor; and a feedback latch circuit electrically connected between the output of the output driver circuit and the second end of the capacitor, for maintaining the voltage level at the second end of the capacitor.

Preferably, the feedback latch circuit is a full latch circuit, or a half latch circuit.

From another aspect of the present invention, a level shift method comprises: providing an input signal operating at first high and low operational voltage levels; providing a capacitor and a voltage across the capacitor; driving an output circuit to generate an output signal according to the voltage across the capacitor, the output signal operating at second high and low operational voltage levels in correspondence with the input signal; and controlling the voltage level at one end of the capacitor according to the output signal.

It is to be understood that both the foregoing general description and the following detailed description are provided as examples, for illustration but not for limiting the scope of the invention.

BRIEF DESCRIPTION OF THE DRAWINGS

These and other features, aspects, and advantages of the present invention will become better understood with regard to the following description, appended claims, and accompanying drawings.

DESCRIPTION OF THE PREFERRED EMBODIMENTS

Figure 1:
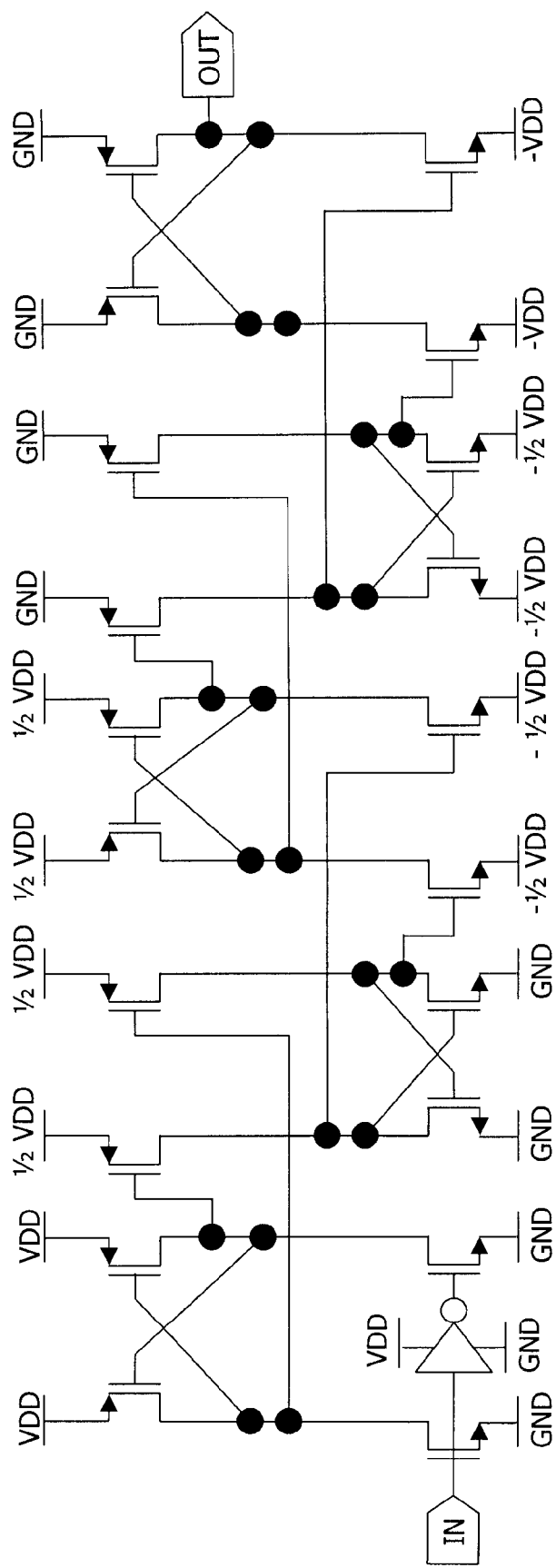
FIGS. 1 and 2 are schematic circuit diagrams of conventional level shift circuits for shifting the levels from positive supply voltage and 0 to 0 and negative supply voltage.
Figure 2:
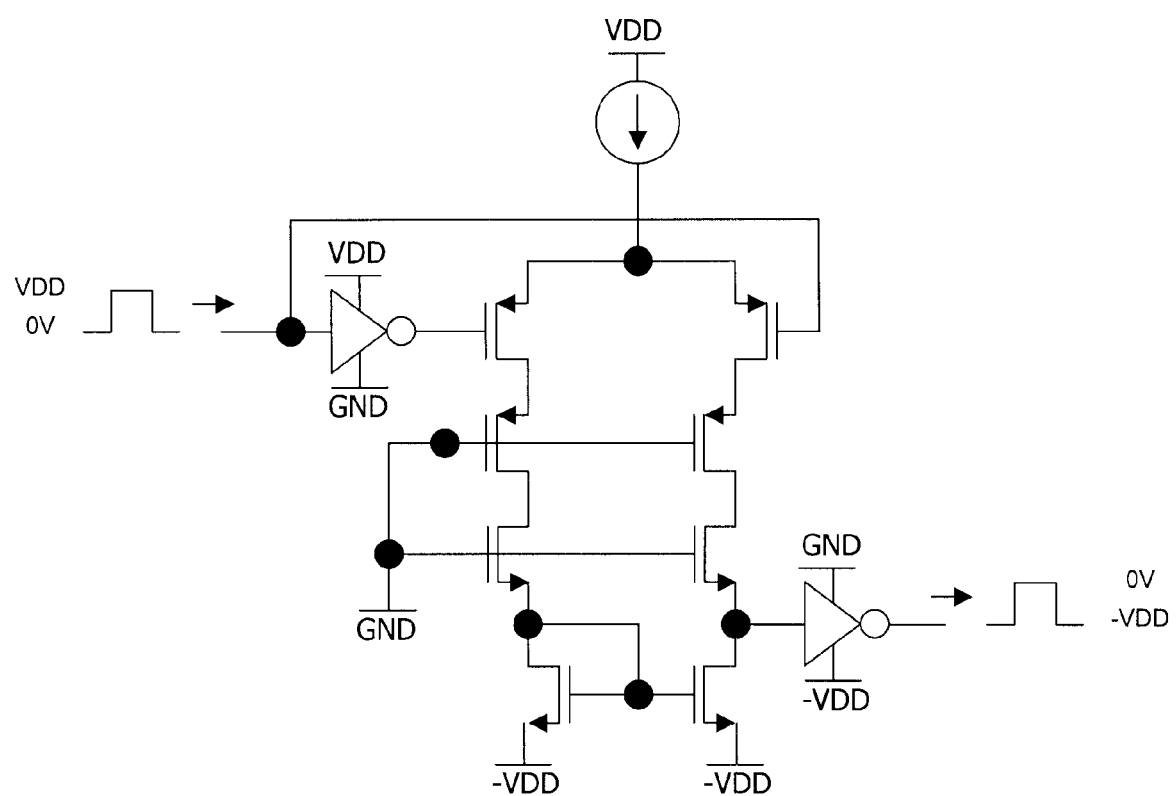
Figure 3:
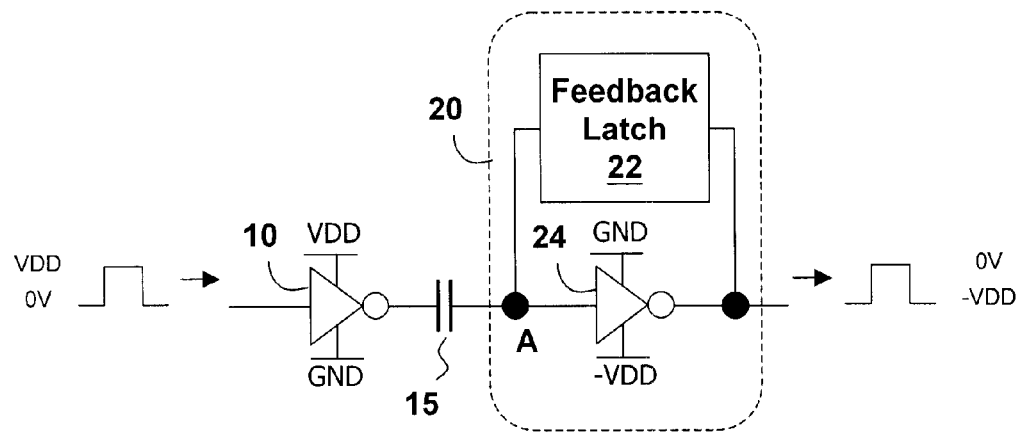
FIG. 3 is a schematic circuit diagram explaining the concept of the present invention.

Referring to the schematic circuit diagram of FIG. 3, the present invention will first be explained with respect to its concept. As shown in the figure, an input driver circuit 10 is provided, which operates at high and low operational voltage levels of VDD and 0V, respectively. The output of the input driver circuit 10 is electrically connected with a capacitor 15, which stores a voltage difference between its two ends. An output driver circuit 20 is electrically connected with the capacitor 15; the output circuit 20 includes an output driver circuit 24 which operates at high and low operational voltage levels of 0V and −VDD, respectively, and a feedback latch circuit 22 which keeps the input node A of the output driver circuit 24 at a desired level by feedback control mechanism.

Figure 4:
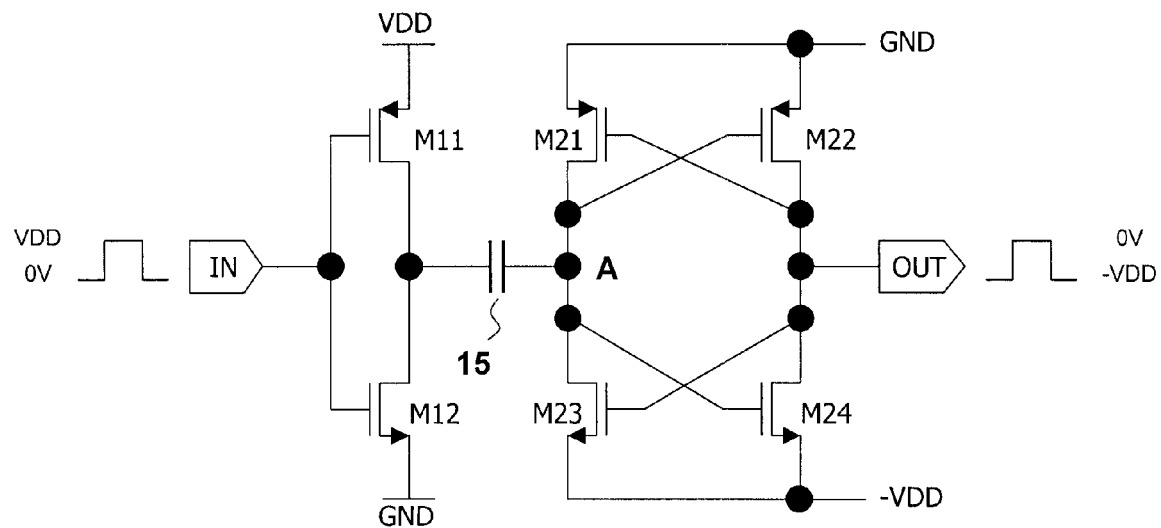
FIG. 4 is a circuit diagram showing an embodiment of the level shift circuit according to the present invention.

The above mentioned concept can be realized in many ways. FIG. 4 shows one embodiment, in which the input driver circuit 10 comprises a PMOS transistor M11 and an NMOS transistor M12, and the output circuit 20 comprises PMOS transistors M21 and M22 and NMOS transistors M23 and M24. The PMOS transistor M22 and the NMOS transistor M24 form the output driver circuit 24, and the PMOS transistor M21 and the NMOS transistor M23 form the feedback latch circuit 22. The feedback latch circuit 22 is a full latch circuit, that is, it provides feedback latching function regardless what level the signal at the output terminal OUT is at.

More specifically, the output terminal OUT feedback controls the gates of the transistors M21 and M23, such that the node A is kept at a correct level. When the output is at its high level (0V), the node A is at low level (−VDD); when the output is at low level (−VDD), the node A is at high level (0V). The node A is kept at the correct level for the purpose to maintain the voltage across the capacitor 15, so that the signals will not be distorted as the time passes by.

Figure 5:
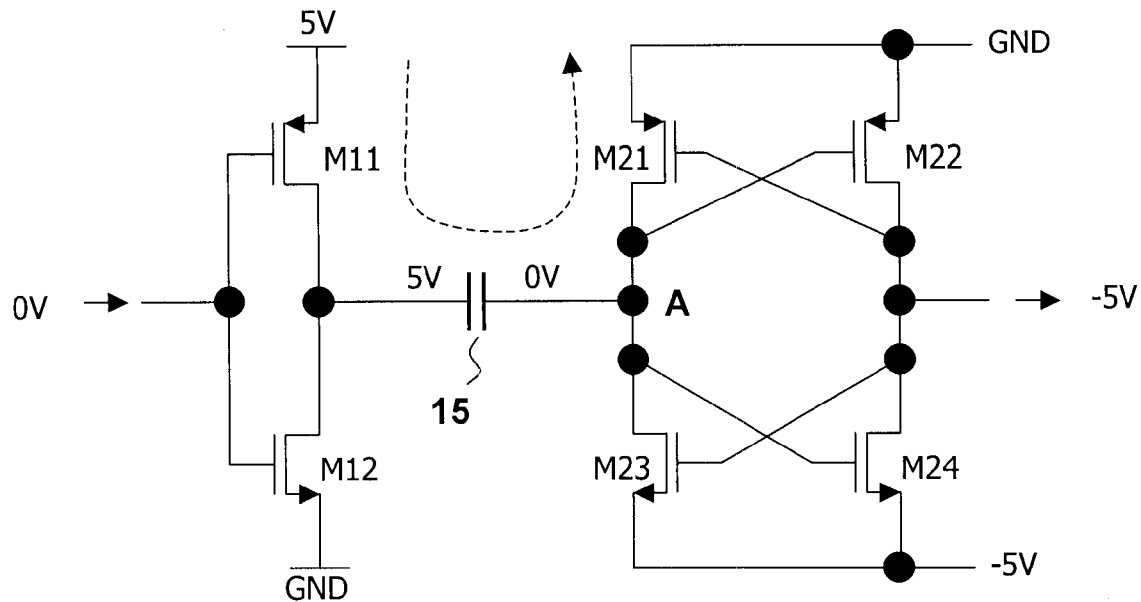
FIGS. 5 and 6 explain the operation of the circuit of FIG. 4.
Figure 6:
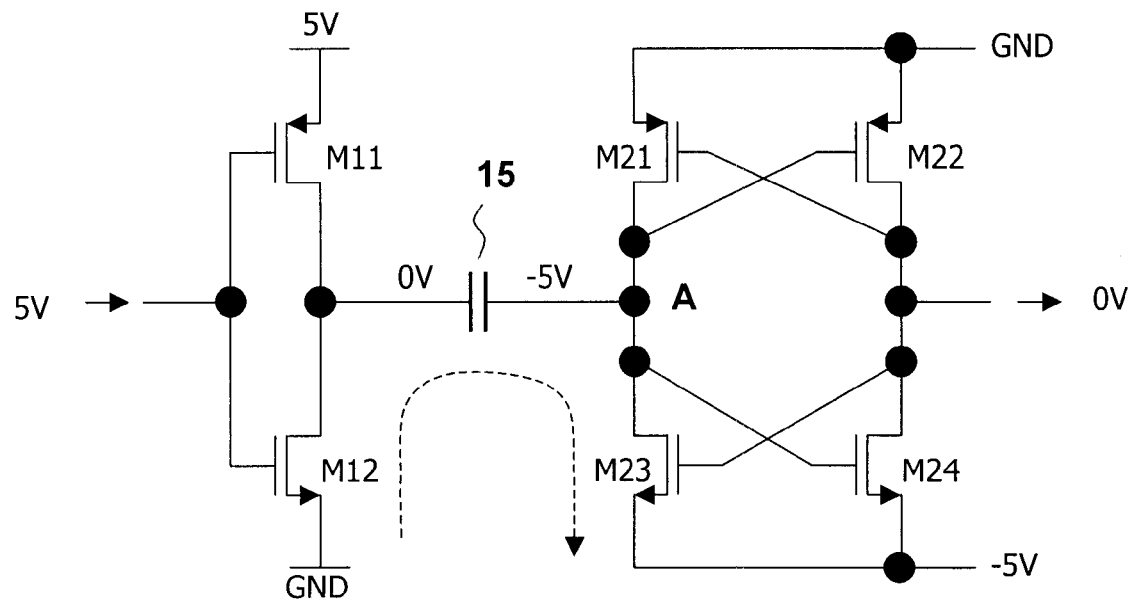

The circuit of FIG. 4 operates in the manners as shown in FIGS. 5 and 6. Assuming that VDD is 5V, when the input of the overall level shift circuit is 0V, the PMOS transistor M11 is ON and the NMOS transistor M12 is OFF, and therefore the node B at the left end of the capacitor 15 is at 5V and the node A at the right end of the capacitor 15 is at its initial state 0V. Thus, a voltage difference of 5V is generated across the capacitor 15. Because the node A is at 0V, the NMOS transistor M24 is ON and the PMOS transistor M22 is OFF, such that the output terminal OUT is at −5V. In addition, the output terminal OUT feedback controls the gates of the transistors M21 and M23, such that the node A is kept at 0V. Thus, as shown by the arrow in the figure, a charging loop [VDD(5V)−

M11-B-(the capacitor 15)-A-M21-GND] is formed to charge the capacitor 15, so as to keep the voltage across the capacitor 15 at 5V.

On the other hand, when the input of the overall level shift circuit is 5V, the PMOS transistor M11 is OFF and the NMOS transistor M12 is ON, and therefore the node B at the left end of the capacitor 15 is at 0V; due to the voltage across the capacitor 15, the node A at the right end of the capacitor 15 becomes −5V. Thus, the PMOS transistor M22 is ON and the NMOS transistor M24 is OFF, such that the output terminal OUT becomes 0V. The output terminal OUT feedback controls the gates of the transistors M21 and M23, such that the node A is kept at −5V. Thus, as shown by the arrow in the figure, a charging loop [GND-M12-B-(the capacitor 15)-A-M23-VDD(−5V)] is formed to charge the capacitor 15, so as to keep the voltage across the capacitor 15 at 5V.

Figure 7:
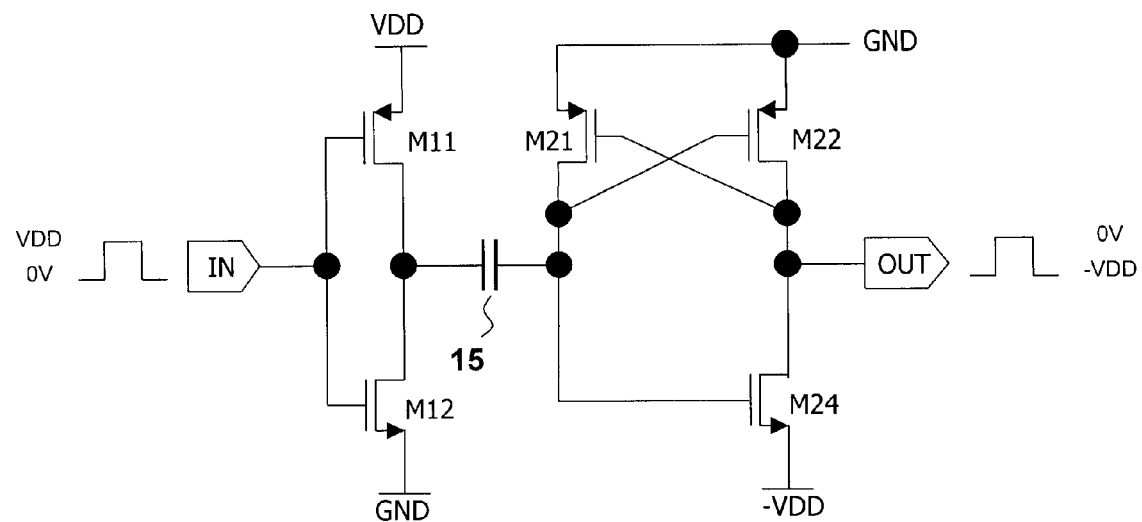
FIGS. 7 and 8 are circuit diagram showings two embodiments of the level shift circuit according to the present invention.
Figure 8:
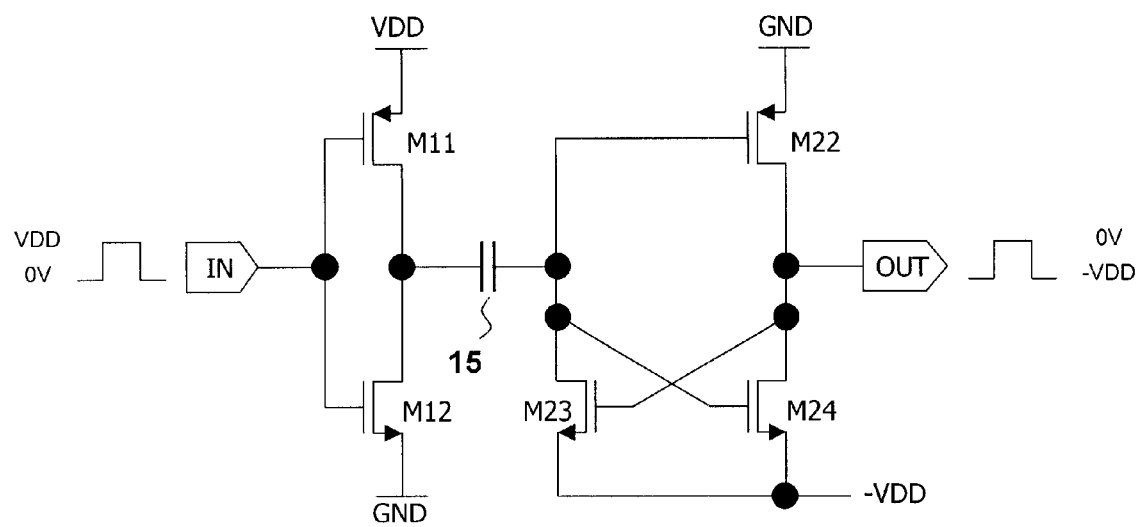

In fact, the feedback latch circuit 22 does not have to be a full latch circuit. It can be arranged otherwise, to further reduce the number of devices. Referring to FIG. 7, in this embodiment, the feedback latch circuit 22 is made of a half latch circuit comprising only one transistor M21. This circuit feedback controls the voltage level of the node A only when the output terminal OUT is at low level. Referring to FIG. 8 for another example, in this embodiment, the feedback latch circuit 22 is made of a half latch circuit comprising only one transistor M23. This circuit feedback controls the voltage level of the node A only when the output terminal OUT is at high level. The embodiments of FIGS. 7 and 8 also belong to the scope of the present invention.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, any type of latch circuit may be used to feedback control the node A. As another example, the present invention may be applied to other types of level shift circuits, not necessarily limited to the level shift circuit for level shift from positive supply voltage to negative supply voltage. In view of the foregoing, it is intended that the present invention cover all such and other modifications and variations, which should be interpreted to fall within the scope of the following claims and their equivalents.

What is claimed is:

1. A level shift circuit comprising:
   an input driver circuit for receiving a single-line input signal and operating in a voltage swing between high and low operational voltage levels which are positive supply voltage (VDD) and 0, respectively;
   a capacitor having a first end electrically connected with the output of the input driver circuit, the capacitor being for maintaining a voltage difference substantially equal to the supply voltage (VDD) between its first end and second end;
   an output driver circuit electrically connected with the second end of the capacitor, the output driver circuit operating in a voltage swing between high and low operational voltage levels which are 0 and negative supply voltage (−VDD), respectively; and
   a feedback latch circuit electrically connected between the output of the output driver circuit and the second end of the capacitor, for maintaining the voltage level at the second end of the capacitor without consuming substantial power.

2. The level shift circuit of claim 1, wherein the feedback latch circuit is a full latch circuit.

3. The level shift circuit of claim 2, wherein the full latch circuit includes a pair of transistors including a PMOS and an NMOS transistor each having a drain electrically connected with a drain of the other transistor, and each having a gate electrically connected with a gate of the other transistor and also electrically connected with the output of the output driver circuit.

4. The level shift circuit of claim 1, wherein the feedback latch circuit is a half latch circuit.

5. The level shift circuit of claim 4, wherein the half latch circuit includes a transistor having a gate controlled by the output of the output driver circuit, and a drain electrically connected with the second end of the capacitor.

6. The level shift circuit of claim 1, wherein the input driver circuit is an inverter including a pair of transistors including a PMOS and an NMOS transistor each having a drain electrically connected with a drain of the other transistor, and each having a gate electrically connected with a gate of the other transistor, the drain of one of the transistors being the output of the input driver circuit.

7. The level shift circuit of claim 1, wherein the output driver circuit is an inverter including a pair of transistors including a PMOS and an NMOS transistor each having a drain electrically connected with a drain of the other transistor, and each having a gate electrically connected with a gate of the other transistor, the drain of one of the transistors being the output of the output driver circuit.

8. A level shift method comprising:
   providing a single-line input signal operating in a voltage swing between first high and low operational voltage levels;
   providing a capacitor with a voltage across the capacitor, the voltage across the capacitor being substantially equal to the voltage difference between the first high and low operational voltage levels;
   driving an output circuit to generate an output signal according to the voltage across the capacitor, the output signal operating at second high and low operational voltage levels in correspondence with the input signal, wherein the voltage difference between the second high and low operational voltage levels is substantially equal to the voltage difference between the first high and low operational voltage levels, and wherein the second high operational voltage level is substantially equal to the first low operational voltage level; and
   feedback-latching the voltage level at one end of the capacitor according to the output signal without consuming substantial power.

9. The level shift method of claim 8, wherein the first high and low operational voltage levels are positive supply voltage (VDD) and 0, respectively.

10. The level shift method of claim 8, wherein the second high and low operational voltage levels are 0 and negative supply voltage (−VDD), respectively.

* * * * *